United States Patent [19]
Wayner

[11] Patent Number: 6,084,430
[45] Date of Patent: Jul. 4, 2000

[54] INPUT BUFFER FOR A MIXED VOLTAGE ENVIRONMENT

[75] Inventor: Zelig Wayner, Haifa, Israel

[73] Assignee: Intel Corporation, Santa Clara, Calif.

[21] Appl. No.: 09/002,232

[22] Filed: Dec. 31, 1997

[51] Int. Cl.[7] .................. H03K 19/0175; H03K 19/094
[52] U.S. Cl. ................... 326/80; 326/86; 326/83
[58] Field of Search .................. 326/80, 81, 86, 326/83, 90, 95, 98

[56] References Cited

U.S. PATENT DOCUMENTS

| | | | |
|---|---|---|---|
| 4,677,317 | 6/1987 | Sakuma | 326/81 |
| 4,899,066 | 2/1990 | Aikawa et al. | 326/98 |
| 5,204,557 | 4/1993 | Nguyen | 326/81 |
| 5,352,942 | 10/1994 | Tanaka et al. | 326/80 |
| 5,378,943 | 1/1995 | Dennard | 326/68 |
| 5,463,330 | 10/1995 | Tsuchida | 326/81 |
| 5,465,054 | 11/1995 | Erhart | 326/34 |
| 5,650,742 | 7/1997 | Hirano | 327/333 |
| 5,723,986 | 3/1998 | Nakashiro et al. | 326/81 |
| 5,789,942 | 8/1998 | Mizuno | 326/81 |
| 5,892,371 | 4/1999 | Maley | 326/81 |

*Primary Examiner*—Michael Tokar
*Assistant Examiner*—Daniel D. Chang
*Attorney, Agent, or Firm*—Blakely, Sokoloff, Taylor & Zafman LLP

[57] ABSTRACT

An input buffer to interface between a main logic circuit and a peripheral device, which includes a first transistor that is adapted to be coupled to a first voltage supply and a first terminal, is described. A second transistor, which is adapted to be coupled to a second voltage supply and said terminal, is also included. The input buffer includes a first logic circuit to limit the amount of voltage applied to the first and second enable terminals of the first and second transistors. The first logic circuit is adapted to be coupled to a second terminal, the first enable terminal, and the second enable terminal. A second logic circuit, designed to limit the amount of voltage applied to the first terminal, is also included. The second logic circuit is coupled to the input terminals of the first and second transistors, as well as the first terminal. A method for buffering a signal received from a peripheral component includes receiving a first signal from a peripheral component. The voltage level of the first signal is reduced, and it is applied to the enable terminals of a first and a second transistor. A second signal is applied to an output terminal, and the voltage level of the second signal is limited. The second signal is then transmitted to an internal component.

30 Claims, 4 Drawing Sheets

INPUT BUFFER FOR A MIXED VOLTAGE ENVIRONMENT

BACKGROUND OF THE INVENTION

1. Field of the Invention

The invention relates in general to the field of logic circuits, and, more particularly, to logic circuits used in computer systems. Specifically, the invention relates to an input buffer to interface between a central processing unit and other components on a main logic circuit within a mixed voltage environment.

2. Description of the Related Art

With the growing complexity of modern computer systems and the availability of various types of peripheral devices on the main circuit board, designers are constantly seeking more efficient methods to improve the circuits that serve as interfaces between these peripheral devices and the central processing unit.

Typically, a voltage $V_{cc}$ is associated with a processor voltage supply, while a voltage $V_{ccp}$ is associated with a peripheral voltage supply. The peripheral voltage Vccp is often larger than the processor supply voltage. The voltage differences between these two voltage levels often warrant an interface circuit within the processor to be positioned between the core of the processor and other external components.

Designers today often utilize advanced processors in which the processor supply voltage level has been lowered quickly because of technological advances, while the peripheral supply voltage is level has been reduced more slowly. This behavior may cause the voltage difference between the peripheral supply voltage and the processor supply voltage to further increase. Transistors generally have a maximum voltage difference $V_{MAXd}$ that can be applied between the enable terminal and either one of the other terminals. When this voltage difference is exceeded, the transistor may become damaged or fail to operate properly. Gate stress generally results when a voltage difference beyond the maximum voltage difference $V_{MAXd}$ is applied to the enable terminal of a transistor. One skilled in the art will appreciate that the voltage difference $V_{Maxd}$ is typically a little more than the voltage $V_{cc}$, though lower than the voltage $V_{ccp}$. This characteristic of the voltage difference hinders the input signals from being applied directly to internal transistors within the central processing unit.

To reduce the likelihood of damaging a microprocessor (i.e., central processing unit), signals that are generated by a peripheral device and are to be sent to the microprocessor are generally first sent to an input buffer before being sent to other locations within the processor. The input buffer generally receives the input signal and generates a corresponding signal with a voltage level within an allowed range. The input buffer may also be designed to improve the quality of the input signal by removing some of the distortion such that the signals may be used more effectively.

Figure 1:
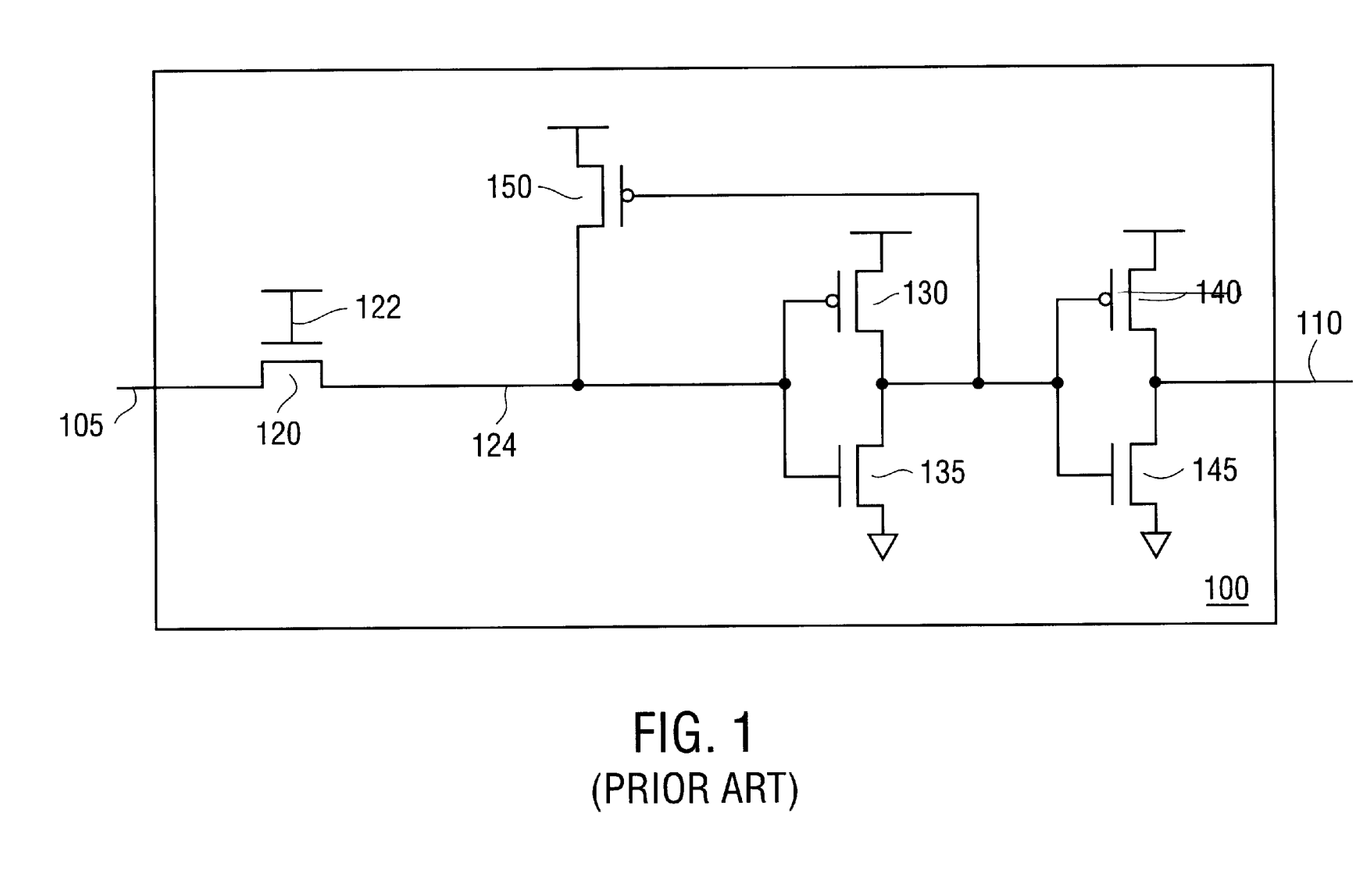
FIG. 1 is a circuit diagram for a conventional input buffer.

FIG. 1 is a circuit diagram for a conventional input buffer 100 in which an input signal from a peripheral device is applied to a line 105. The input buffer 100 generates an output signal corresponding to the input signal, which is applied to a line 110 and sent to other logic devices inside the processor. A transistor 120 has a gate (enable) terminal 122 coupled to a reference voltage supply, which generates a logically high voltage equal to the voltage $V_{cc}$. When a logically high voltage is applied to the gate terminal 122, the transistor 120 conducts, allowing the input signal applied to the line 105 to be applied to a line 124.

If a high signal is applied to the line 105, the transistor 120 reduces the voltage of the signal passed to the line 124 to approximately the voltage $V_{cc}-V_{tn}$. As previously mentioned, the reference voltage from a peripheral power supply is generally considerably higher than the reference voltage from processor power supply. The voltage level of the logically high input signal is referenced to the voltage $V_{ccp}$ and may vary slightly above or below that voltage. By sending the input signal through the transistor 120, the voltage level of the signal is reduced considerably to the voltage $V_{cc}-V_{tn}$.

By reducing the voltage level of the signal on the line 124, the transistors 130, 135 are not subjected to gate stress. In addition, the transistor 120 is protected from gate stress because the gate terminal is connected to voltage $V_{cc}$ constantly. One skilled in the art will appreciate, if the transistor 120 was removed, the transistors 130, 135 may suffer from gate stress. In addition, the transistors 130, 135; 140, 145 are configured to function as an inverter. Thus, the logic state of the signal on the line 110 would be same as the logic state of the signal on the line 105. A transistor 150 may be used to pull the line 124 to the voltage $V_{cc}$ instead of remaining at the voltage $V_{cc}-V_{tn}$.

One skilled in the art will appreciate that the input buffer 100 simply passes any logically low signals applied to the line 105 without affecting their voltage level. The input buffer 100 functions to reduce the peripheral voltage level on the line 124 in such a manner as to reduce the probability of causing gate stress on the transistors 130, 135 in the first inverting stage. When the core reference voltage $V_{cc}$ is lowered, the voltage level of the signal applied to the line 124 is reduced. One skilled in the art will appreciate that this voltage reduction may be desired in advanced processors. The voltage level generally needed to activate (i.e., trip) the inverting stages, consisting of the transistors 130–145, is approximately equal to the voltage $\frac{1}{2}V_{cc}$.

By reducing the voltage level on the line 124, the inverting stages may malfunction because the voltage on the line may be sufficiently close to the trip voltage. Although the input signal reaches the voltage $V_{ccp}$, the NMOS pass gate 120 passes only the voltage $V_{cc}-V_{tn}$. This voltage may not be sufficient to switch the first inverting stage of the input buffer, since the voltage $V_{cc}-V_{tn}$ is often not larger than the trip voltage of the first inverting stage, which includes the transistors 130, 135, when the voltage $V_{cc}$ is reduced. Alternatively, the first inverting stage may switch at a considerably slower rate. Thus, the conventional input buffer 100 is sensitive to the value of the core reference voltage $V_{cc}$. It would be beneficial to have an input buffer that is capable of overcoming the shortcomings of conventional input buffers.

Another disadvantage of the input buffer 100 occurs when the maximum low voltage input signal is not equal to a voltage $V_{ss}$, and instead is equal to a voltage very close to the an industry standard voltage of 0.7 volts. In this case, the first inverting stage (i.e., the transistors 130, 135) would fail to switch because it would not recognize the voltage level of the signal on the line 124 as a logic zero. In addition, the use of core voltage supply for the first inverting stage of the input buffer limits the input buffer's maximum input low value as the voltage $V_{cc}$ is reduced. When the voltage $V_{cc}$ is reduced, trip point is reduced accordingly, which inhibits recognition of low voltages. The reduction of the trip point generally leaves a small noise margin, causing the probability of false logic to increase. Thus, it would be beneficial to have an input buffer that is capable of overcoming the shortcomings of conventional input buffers.

SUMMARY OF THE INVENTION

The invention relates to an input buffer to interface between a main logic circuit and a peripheral device, which includes a first transistor that is adapted to be coupled to a first voltage supply and a first terminal. A second transistor, which is adapted to be coupled to a second voltage supply and said terminal, is also included. The input buffer includes a first logic circuit to limit the amount of voltage applied to the first and second enable terminals of the first and second transistors. The first logic circuit is adapted to be coupled to a second terminal, the first enable terminal, and the second enable terminal. A second logic circuit, designed to limit the amount of voltage applied to the first terminal, is also included. The second logic circuit is coupled to the input terminals of the first and second transistors, as well as the first terminal.

A method for buffering a signal received from a peripheral component includes receiving a first signal from a peripheral component. The voltage level of the first signal is reduced, and it is applied to the enable terminals of a first and a second transistor. A second signal is applied to an output terminal, and the voltage level of the second signal is limited. The second signal is then transmitted to an internal component.

BRIEF DESCRIPTION OF THE DRAWINGS

Other objects and advantages of the invention will become apparent upon reading the following detailed description and upon reference to the drawings in which.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below as they might be employed in an input buffer. In the interest of conciseness, not all features of an actual implementation are described in this specification. It will of course be appreciated that in the development of any actual embodiment, numerous implementation-specific decisions must be made to achieve the developer's specific goals, such as compliance with system-related and business-related constraints. Moreover, it will be appreciated that even if such a development effort might be complex and time-consuming, it would nevertheless be a routine undertaking for one of ordinary skill having the benefit of this disclosure.

Overview

Figure 2:
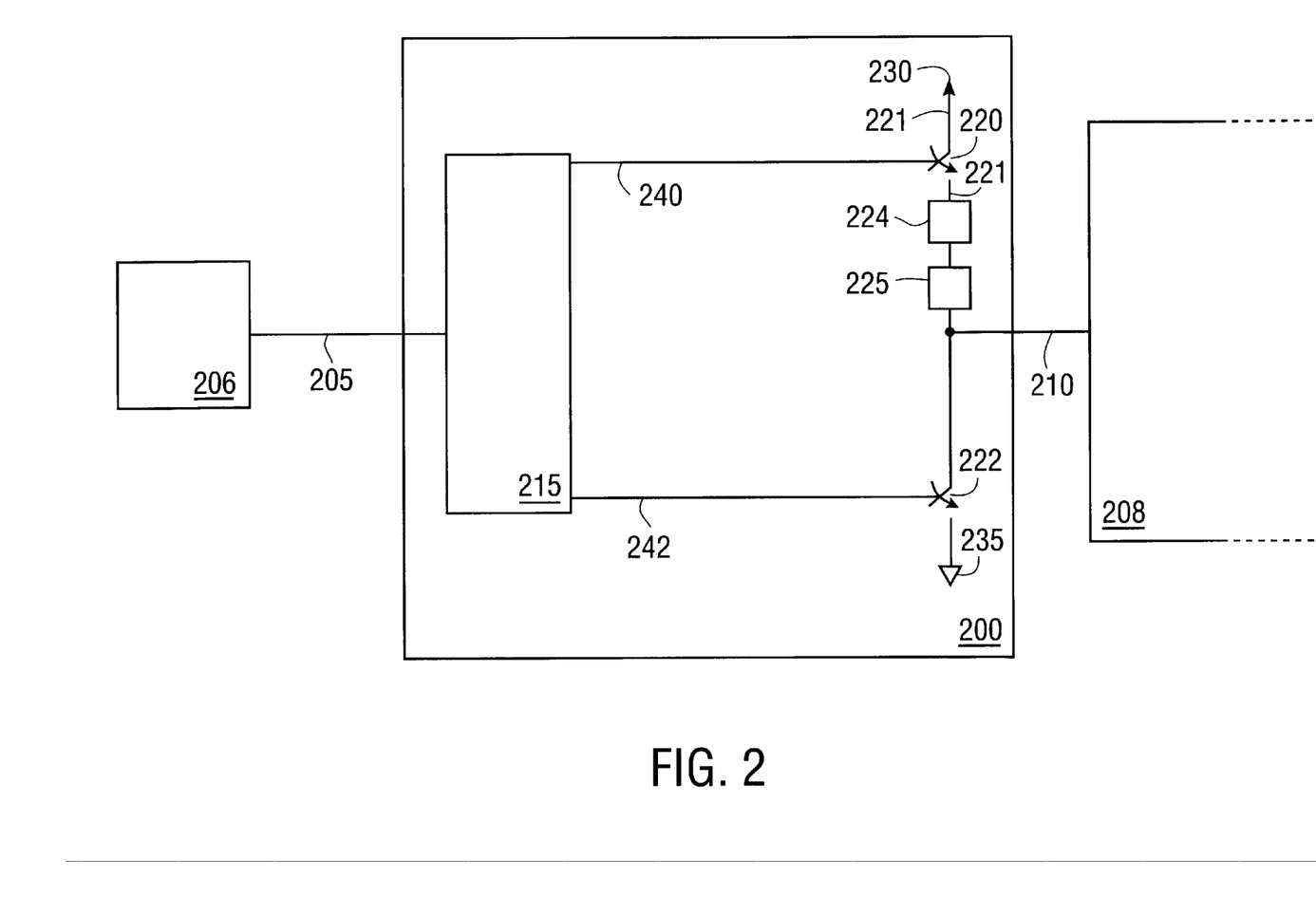
FIG. 2 is a general schematic diagram for a system with an input buffer in accordance with the invention.

FIG. 2 is a simplified block diagram for an input buffer 200 in accordance with the present invention, which is connected to the peripheral component 206 by a line 205, and is connected to a core circuit 208 within a microprocessor (i.e., the motherboard) by a line 210. As previously mentioned, signals are transmitted between the peripheral device 206 and the core circuit 208 by the input buffer 200. The input buffer 200 functions as an interface circuit that conditions the input signal in such a manner that it can be used effectively by the internal circuit board.

A signal emitted by the peripheral devices 206 and applied to the line 205 is received by the logic circuit 215 within the input buffer 200. The logic circuit 215 may be used to control the position of switches 220, 222, such that a voltage may be passed from one terminal of the switch to the other. For example, the switch 220 is connected to a peripheral reference voltage supply 230, which generates a voltage $V_{ccp}$ on a line 221. When the logic circuit 215 applies a voltage within a designated voltage region to a line 240, the switch 220 will close, enabling a voltage approximately equal to the voltage $V_{ccp}$ to be sent to the logic circuit 225.

Similarly, the logic circuit 215 may apply a voltage in a second designated region to a line 242 to close the switch 222. The closing of the switch 222 will enable a voltage $V_{ss}$ from the ground voltage supply 235 to be applied to the line 210. The switches 220, 222 may be designed for alternate operation. The logic circuit 215 may also be designed to receive the input signal and limit the voltage level of the signals applied to the lines 240, 242, such that the switches 220, 222 do not suffer from gate stress. The logic circuits 225 may also be designed to limit the voltage level of signals applied to the line 210 to prevent other components within the core circuit 208 from suffering from gate stress. In addition, the logic circuit 224 is protecting the switch 220 from gate stress.

This invention uses a two-stage input buffer to cope with a mixed voltage environment (i.e., an environment with both peripheral and core voltage supplies). The first inverting stage of the input buffer uses a periphery supply voltage and reduces the maximum voltage received from the peripheral power supply to avoid gate stress on the second stage of the input buffer. The second stage is an inverter that uses a core supply voltage. The input buffer is fully functional, complies with defined timing requirements, and supplies the desired protection against gate stress.

A Specific Embodiment

Figure 3:
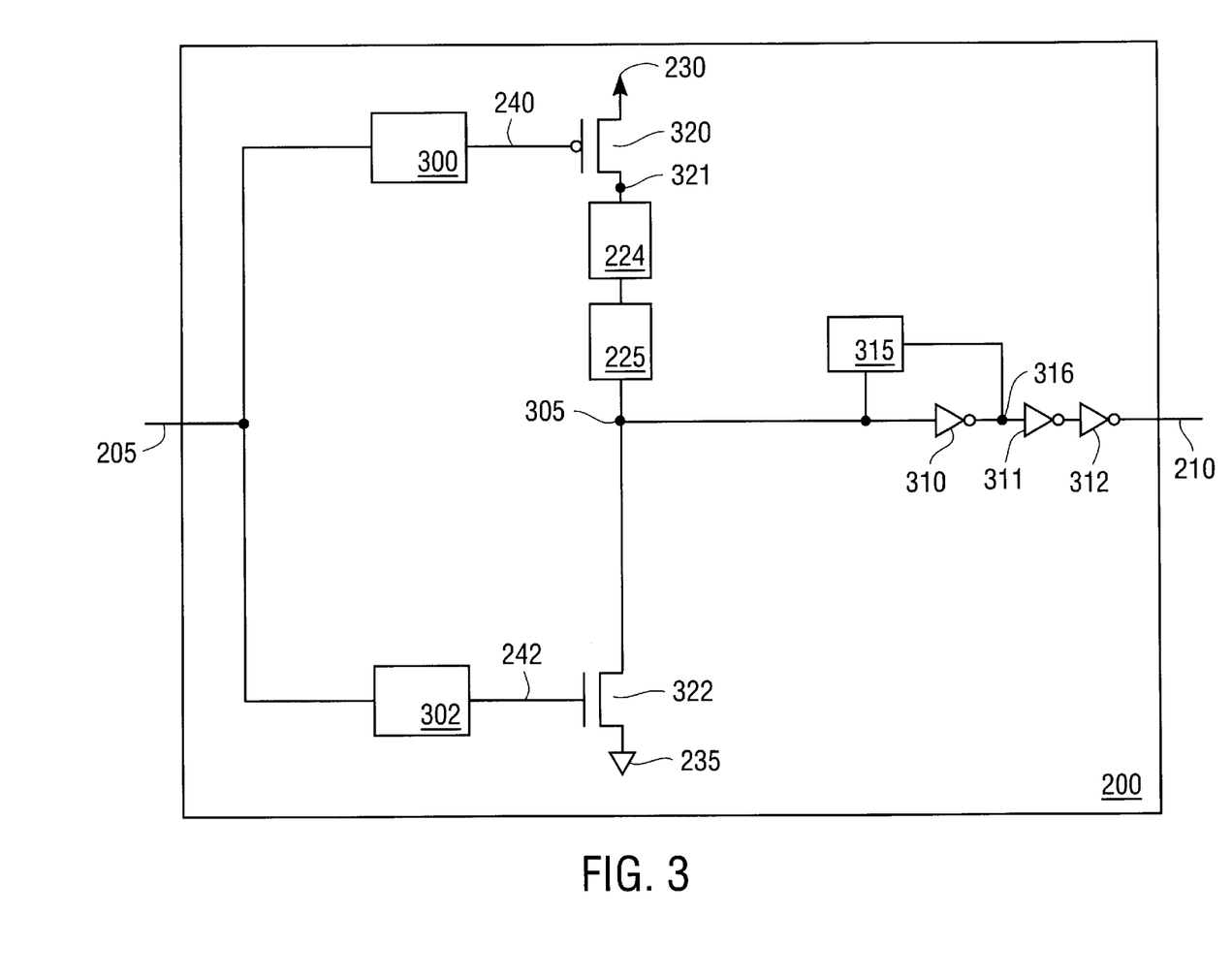
FIG. 3 is a schematic and block diagram of an input buffer according to the invention.

FIG. 3 is a schematic diagram for an input buffer 200 in accordance with on aspect of the invention, which is connected to at least one peripheral device by the line 205 and the core circuit 208 by the line 210. The logic circuit 215 has been split into two separate circuits 300, 302, which are respectively connected to gate terminals of the transistors 320, 322. One skilled in the art will appreciate that though the transistors 320, 322 are MOS (metal oxide semiconductor) transistors, they may be replaced by any transistor topology (e.g., bipolar transistors and field effect transistors) that allows for complementary transistors.

The logic circuit 300 may be designed to limit the minimum low voltage applied to the gate terminal of the transistor 320. The drain terminal of the transistor 320 is connected to a peripheral voltage supply 230 which generates a voltage $V_{ccp}$. As previously mentioned, gate stress results when the voltage difference between the gate and source terminals or the gate and drain terminals exceeds a maximum stress voltage. Because the voltage $V_{ccp}$ may be a rather large voltage, the circuit 300 may be designed to generate a signal on the line 240 that limits the minimum low voltage to a value that provides a voltage difference less than the maximum stress voltage.

Similarly, the logic circuit 302 may be designed such that it limits the maximum high voltage applied to the line 242. The source of the transistor 322 is coupled to a ground voltage supply 235 that generates a voltage $V_{ss}$, and the drain is connected to a node 305. The voltage level applied to the gate terminal 242 by the logic circuit 302 may be adjusted such that the voltage difference does not exceed the maximum stress voltage. In this manner, the transistors 320, 322 may be protected from gate stress, regardless of the voltage level of the input signal applied to the line 205 by a peripheral device (not shown).

The logic circuit 224 may be designed to function similarly to the logic circuit 300, in that it may be used to limit the minimum low voltage that is applied to the node 321. The logic circuit 225 may be designed to function similarly to the logic circuit 302 in that it can be used to limit the maximum high voltage applied to the node 305. In addition, the use of the logic circuits 224, 225 also enables the voltage on the source terminals of the transistors 320, 322 to be adjusted such that the gate to drain voltage does not exceed the maximum stress voltage.

One skilled in the art will appreciate that the combination of the transistors 320, 322 function as an inverter. Thus, the logic state at the node 305 is the logical inverse of the logic state of the input signal applied to the line 205. For example, a logically high input signal would generate a logically low signal at the node 305. The logic state at this node thus needs to be returned to its original state before being applied to the line 210. The inverters 310–312 and the logic circuit 315 may be used to place the signal on the line 210 in the correct logic state and with improved signal quality. In addition the inverter 310 provides a translation from the peripheral voltage level to the core voltage level.

The voltage level at the node 305 is large enough to switch the inverter 310, yet low enough (due to large bulk effect) to hinder high voltage stress on the gates of the transistors. The output of the inverter 310 is sensed such that when the node 316 is logically low, the node 305 is pulled to a logically high level to help complete the transition of the inverter and avoid high leakage when peripheral power supply voltage $V_{ccp}$ is not much higher than the core reference supply voltage $V_{cc}$. Additional specifics regarding these components have not been included so as not to obscure the present invention.

Figure 4:
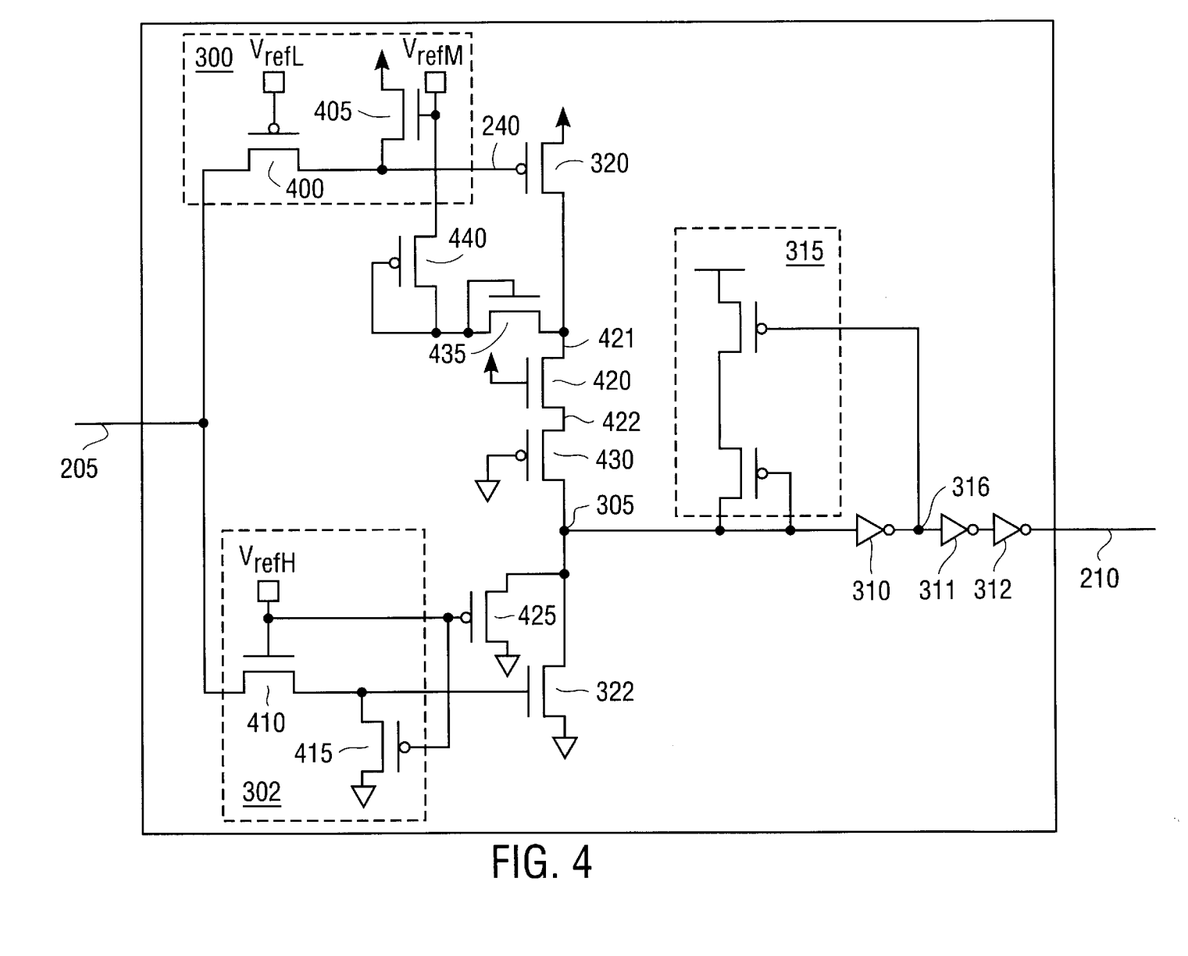
FIG. 4 is a circuit diagram for an embodiment of the input buffer of FIG. 3.

FIG. 4 is a circuit diagram of the input buffer 200 of FIG. 3 which uses alternative reference voltages that may be supplied by a very weak voltage source or generated "on chip" using well known techniques. The reference voltages include the voltage $V_{refL}$, which is approximately equal to the voltage $\frac{1}{3}V_{ccp}$, the voltage $V_{refM}$ which is approximately ½ $V_{ccp}$, and the voltage $V_{refH}$, which is approximately ⅔ $V_{ccp}$. One skilled in the art will appreciate that there are several well known techniques for the generation of the above listed reference voltages.

The logic circuit 300 includes a PMOS transistor 400 and an NMOS transistor 405 (see FIG. 4), which has a gate terminal connected to the $V_{refM}$ voltage source. The transistor 400 has a gate terminal coupled to the $V_{refL}$ voltage source, such that it is normally "on." When the input signal is a logically high signal, the complete voltage (e.g., $V_{ccp}$) is applied to the line 240 and the gate terminal of the transistor 320. When the input signal is a logically low signal, the voltage on the line 240 is reduced to a voltage approximately equal to the voltage $V_{tp}+V_{refL}$.

Since this voltage (i.e., the voltage $V_{tp}+V_{refL}$) would provide a smaller voltage difference between the gate terminal and source terminal, which is connected to $V_{ccp}$, the probability that the transistor 320 will suffer from gate stress is tremendously reduced. The transistor 405 further reduces this likelihood by hindering the line 240 from reaching voltage levels less than $V_{refM}-V_{tn}$ by subthreshold conduction. As previously mentioned, the logic circuit 300, which includes the transistors 400, 405, limits the minimum low voltage that is applied to the line 240.

The logic circuit 225 is designed to limit the maximum high voltage that is applied to the node 305 by using transistors 420, 425. The NMOS transistor 420 has a voltage $V_{ccp}$ applied to its gate terminal which causes it to remain "on," such that a voltage may be passed from its drain terminal 421 to its source terminal 422. When the transistor 320 is conducting, a voltage approximately equal to the voltage $V_{ccp}$ is applied to the terminal 421.

The voltage $V_{ccp}$ would cause gate stress if applied to devices in the core circuit, but the transistor 420 reduces the voltage applied to the terminal 422 to the voltage $V_{ccp}-V_{tn}$. Because of the small value of the voltage $V_{tn}$ bulk effect, this difference reduces the likelihood of gate stress. The transistor 425, which has a voltage $V_{refH}$ applied to its gate, hinders the node 305 from leaking to a voltage level above the maximum voltage $V_{refH}+V_{tp}$. Thus, the logic circuit 225 hinders gate stress by limiting the maximum high voltage that is applied to the node 305.

One skilled in the art will appreciate that the logic circuit 302 uses transistors 410, 415 to limit the maximum high voltage applied to the gate terminal of the transistor 322. Similarly, the logic circuit 224 uses the transistors 430, 435, 440 to limit the minimum low voltage applied to the nodes 421, 422. As previously mentioned, the logic circuits 224, 225 together may provide a voltage at the node 305 that will enable the inverter 310 to switch properly and provide the appropriate logic state on the line 210.

By using a two-stage input buffer, the present invention provides a 150 percent improvement in the propagation delay over the prior art input buffer, with essentially no sensitivity to fluctuations in the core reference voltage $V_{cc}$. Similarly, the minimum low input voltage level has been improved by more than sixty percent over conventional buffers. An input buffer in accordance with the invention provides tremendous results by utilizing an inverter that is referenced to the periphery supply levels, while providing full gate stress protection.

It will be appreciated by those of ordinary skill in the art having the benefit of this disclosure that numerous variations from the foregoing illustration will be possible without departing from the inventive concept described herein. Accordingly, it is the claims set forth below, and not merely the foregoing illustration, which are intended to define the exclusive rights of the invention.

What is claimed is:

1. A method comprising:
   receiving a first signal referenced to a first voltage supply; and
   generating, based on the first signal, a second signal referenced to a second voltage supply less than the first voltage supply, wherein the generating is performed by circuitry powered by the first voltage supply,
   wherein the generating comprises selectively activating a transistor based on the first signal to couple the first voltage supply to an output terminal and limiting the amount of voltage applied to the output terminal to generate the second signal, and wherein the generating comprises limiting the amount of voltage applied to activate the transistor.

2. The method of claim 1, comprising enhancing the second signal.

3. The method of claim 1, comprising:
generating, based on the second signal, a third signal referenced to the second voltage supply, wherein the generating the third signal is performed by circuitry powered by the second voltage supply.

4. The method of claim 3, wherein the receiving comprises receiving the first signal from a peripheral device and wherein the generating the third signal comprises generating the third signal for output to processor circuitry.

5. A method comprising:
receiving a first signal referenced to a first voltage supply; and
generating, based on the first signal, a second signal referenced to a second voltage supply less than the first voltage supply, wherein the generating is performed by circuitry powered by the first voltage supply,
wherein the generating comprises selectively activating a transistor based on the first signal to couple a third voltage supply to an output terminal to generate the second signal, and
wherein the generating comprises limiting the amount of voltage applied to activate the transistor.

6. The method of claim 5, comprising enhancing the second signal.

7. The method of claim 5, comprising:
generating, based on the second signal, a third signal referenced to the second voltage supply, wherein the generating the third signal is performed by circuitry powered by the second voltage supply.

8. The method of claim 7, wherein the receiving comprises receiving the first signal from a peripheral device and wherein the generating the third signal comprises generating the third signal for output to processor circuitry.

9. A circuit comprising:
(a) an input terminal to receive a first signal referenced to a first voltage supply; and
(b) circuitry powered by the first voltage supply to generate, based on the first signal, a second signal referenced to a second voltage supply less than the first voltage supply, wherein the circuitry comprises:
(i) a transistor to couple the first voltage supply to an output terminal,
(ii) circuitry to activate the transistor selectively based on the first signal,
wherein the circuitry to activate the transistor limits the amount of voltage applied to activate the transistor, and
(iii) circuitry to limit the amount of voltage applied to the output terminal to generate the second signal.

10. The circuit of claim 9, wherein the transistor is a p-channel metal oxide semiconductor (PMOS) transistor.

11. The circuit of claim 9, wherein the circuitry to activate the transistor comprises at least two complementary transistors.

12. The circuit of claim 9, wherein the circuitry to limit the amount of voltage applied to the output terminal comprises at least two complementary transistors.

13. The circuit of claim 9, comprising:
circuitry powered by the second voltage supply to generate, based on the second signal, a third signal referenced to the second voltage supply.

14. The circuit of claim 9, comprising circuitry to enhance the second signal.

15. A circuit comprising:
(a) an input terminal to receive a first signal referenced to a first voltage supply; and (b) circuitry powered by the first voltage supply to generate, based on the first signal, a second signal referenced to a second voltage supply less than the first voltage supply, wherein the circuitry comprises:
(i) a transistor to couple a third voltage supply to an output terminal, and
(ii) circuitry to activate the transistor selectively based on the first signal to generate the second signal, wherein the circuitry to activate the transistor limits the amount of voltage applied to activate the transistor.

16. The circuit of claim 15, wherein the transistor is an n-channel metal oxide semiconductor (NMOS) transistor.

17. The circuit of claim 15, wherein the circuitry to activate the transistor comprises at least two complementary transistors.

18. The circuit of claim 15, comprising:
circuitry powered by the second voltage supply to generate, based on the second signal, a third signal referenced to the second voltage supply.

19. The circuit of claim 15, comprising circuitry to enhance the second signal.

20. A computer system comprising:
(a) a peripheral device powered by a peripheral voltage supply;
(b) processor circuitry powered by a processor voltage supply less than the peripheral voltage supply; and
(c) an interface circuit comprising:
(i) an input terminal to receive from the peripheral device a first signal referenced to the peripheral voltage supply, and
(ii) circuitry powered by the peripheral voltage supply to generate, based on the first signal, a second signal referenced to the processor voltage supply, wherein the circuitry powered by the peripheral voltage supply comprises:
(A) a first transistor to couple the peripheral voltage supply to an output terminal,
(B) a second transistor to couple a ground voltage supply to the output terminal,
(C) circuitry to activate the first and second transistors selectively based on the first signal, wherein the circuitry to activate the first and second transistors comprises:
(1) circuitry to limit the amount of voltage applied to activate the first transistor, and
(2) circuitry to limit the amount of voltage applied to activate the second transistor, and
(D) circuitry to limit the amount of voltage applied to the output terminal to generate the second signal.

21. The computer system of claim 20, wherein the interface circuit comprises circuitry powered by the processor voltage supply to generate, based on the second signal, a third signal referenced to the processor voltage supply.

22. The computer system of claim 20, wherein the circuitry to limit the amount of voltage applied to activate the first transistor comprises at least two complementary transistors, and
wherein the circuitry to limit the amount of voltage applied to activate the second transistor comprises at least two complementary transistors.

23. The computer system of claim 20, wherein the circuitry to limit the amount of voltage applied to the output terminal comprises at least two complementary transistors.

24. A circuit comprising:
(a) a first stage circuit powered by a first voltage supply comprising:
  (i) a first transistor to couple the first voltage supply to an output terminal of the first stage circuit,
  (ii) a second transistor to couple a second voltage supply to the output terminal of the first stage circuit,
  (iii) circuitry to activate the first and second transistors selectively based on an input signal, wherein the circuitry to activate the first and second transistors comprises:
    (A) circuitry to limit the amount of voltage applied to activate the first transistor, and
    (B) circuitry to limit the amount of voltage applied to activate the second transistor, and
      (iv) circuitry to limit the amount of voltage applied to the output terminal; and
(b) a second stage circuit powered by a third voltage supply less than the first voltage supply to generate an output signal based on a voltage level at the output terminal of the first stage circuit.

25. The circuit of claim 24, wherein the circuitry to activate the first and second transistors comprises at least two complementary transistors.

26. The circuit of claim 24, wherein the circuitry to limit the amount of voltage applied to the output terminal comprises at least two complementary transistors.

27. The circuit of claim 24, wherein the first transistor is a p-channel metal oxide semiconductor (PMOS) transistor and the second transistor is an n-channel metal oxide semiconductor (NMOS) transistor.

28. A circuit comprising:

a first transistor to couple a first voltage supply to an output terminal;

a second transistor to couple a second voltage supply to the output terminal;

means for selectively activating the first and second transistors based on an input signal referenced to the first voltage supply and for limiting the amount of voltage applied to activate the first and second transistors; and means for limiting the amount of voltage applied to the output terminal for generating an output signal referenced to a third voltage supply less than the first voltage supply.

29. The circuit of claim 28, wherein the means for selectively activating the first and second transistors comprises at least two complementary transistors.

30. The circuit of claim 28, wherein the means for limiting the amount of voltage applied to the output terminal comprises at least two complementary transistors.

* * * * *

UNITED STATES PATENT AND TRADEMARK OFFICE
CERTIFICATE OF CORRECTION

PATENT NO.   : 6,084,430
DATED        : July 4, 2000
INVENTOR(S)  : Wayner

It is certified that error appears in the above-identified patent and that said Letters Patent is hereby corrected as shown below:

Column 1,
Line 31, delete "voltage is level" and insert -- voltage level --.

Signed and Sealed this

Eighteenth Day of February, 2003

JAMES E. ROGAN
*Director of the United States Patent and Trademark Office*